(12) United States Patent
Suzuki et al.

(10) Patent No.: US 6,884,634 B2
(45) Date of Patent: Apr. 26, 2005

(54) SPECIFYING METHOD FOR CU CONTAMINATION PROCESSES AND DETECTING METHOD FOR CU CONTAMINATION DURING RECLAMATION OF SILICON WAFERS, AND RECLAMATION METHOD OF SILICON WAFERS

(75) Inventors: Tetsuo Suzuki, Kobe (JP); Satoru Takada, Hayward, CA (US)

(73) Assignees: Kabushiki Kaisha Kobe Seiko Sho (Kobe Steel, Ltd.), Kobe (JP); Kobe Precision Inc., Hayward, CA (US)

( * ) Notice: Subject to any disclaimer, the term of this patent is extended or adjusted under 35 U.S.C. 154(b) by 269 days.

(21) Appl. No.: 10/255,668

(22) Filed: Sep. 27, 2002

(65) Prior Publication Data

US 2004/0063227 A1 Apr. 1, 2004

(51) Int. Cl.[7] ............................ H01L 21/00; H01L 21/66
(52) U.S. Cl. ............................................. 438/4; 438/17
(58) Field of Search ............................ 438/4, 5, 10, 12, 438/13, 14, 17; 324/71.1, 71.5

(56) References Cited

U.S. PATENT DOCUMENTS

| | | | |
|---|---|---|---|
| 3,923,567 | A | 12/1975 | Lawrence |
| 5,622,875 | A | 4/1997 | Lawrence |
| 5,855,735 | A | 1/1999 | Takada et al. |
| 5,885,334 | A | 3/1999 | Suzuki et al. |
| 6,384,415 | B1 | 5/2002 | Suzuki et al. |
| 6,406,923 | B1 | 6/2002 | Inoue et al. |
| 6,451,696 | B1 | 9/2002 | Hara et al. |

FOREIGN PATENT DOCUMENTS

| | | |
|---|---|---|
| JP | 5-315428 | 11/1993 |
| JP | 6-168998 | 6/1994 |
| JP | 7-122532 | 5/1995 |
| JP | 9-17833 | 1/1997 |
| JP | 9-64133 | 3/1997 |
| JP | 2000-164558 | 6/2000 |
| JP | 2001-174375 | 6/2001 |
| JP | 2001-213694 | 8/2001 |
| JP | 2002-158207 | 5/2002 |

OTHER PUBLICATIONS

H. Prigge, et al., J. Electrochem Soc. vol. 138, No. 5, pages 1385–1389, Acceptor Compensation in Silicon Induced by Chemomechanical Polishing;, May 1991.
Micro, pages 41–54, Mar. 2000.

*Primary Examiner*—Evan Pert
(74) *Attorney, Agent, or Firm*—Oblon, Spivak, McClelland, Maier & Neustadt, P.C.

(57) ABSTRACT

A method of specifying a Cu-contamination-causative step or steps in a Si wafer reclamation process including plural steps in combination, comprising: using p-type Si wafers, or p-type Si wafers and n-type Si wafers as monitor wafers, and performing a measuring operation for measuring the electrical resistance of the monitor wafers at least once before and after a single step or a series of successive steps during the Si wafer reclamation process. The present invention is capable of nondestructively, simply, and accurately detecting Cu that can contaminate Si wafers during a Si wafer reclamation process and is capable of specifying a Cu-contamination-causative process.

10 Claims, 6 Drawing Sheets

SPECIFYING METHOD FOR CU CONTAMINATION PROCESSES AND DETECTING METHOD FOR CU CONTAMINATION DURING RECLAMATION OF SILICON WAFERS, AND RECLAMATION METHOD OF SILICON WAFERS

BACKGROUND OF THE INVENTION

1. Field of the Invention

The present invention relates to a method of specifying a Cu-contamination-causative step (or steps) that introduced Cu into a silicon wafer (hereinafter, referred to as "Si wafer"), particularly, a test Si wafer, i.e., a Si wafer used for monitoring a semiconductor chip manufacturing process or for setting operating conditions for a semiconductor device fabricating system, during a reclamation process, a method of detecting Cu-contamination, and a method of reclaiming a Si wafer. Those methods of the present invention are capable of simply, accurately, nondestructively detecting Cu contaminating the wafer during a reclamation process for reclaiming Si wafers coated with metal films including Cu films, and are used effectively for the reclamation of used Si wafers subjected once to a semiconductor device fabricating process.

2. Description of the Related Art

Generally, a method of reclaiming a used Si wafer includes a film-removing process of removing a film formed on a surface of a wafer, a polishing process of polishing the surface of the wafer in a mirror-finished surface, a cleaning process of cleaning the polished wafer, and a quality evaluation process of evaluating the reclaimed wafer. The film-removing process is a process specific to wafer reclamation. Since the condition of a wafer obtained by removing a film from a used wafer is the same as that of a virgin wafer, the reclaimed wafer can be processed by the following processes including the polishing process and the cleaning process, which are the same as those for processing a virgin wafer.

Various Si wafer reclamation methods including an improved film-removing process have been proposed. A film-removing process disclosed in Reference patent document 1 (U.S. Pat. No. 5,855,735) removes a film by forming shallow microcracks in the film by using a polishing liquid containing abrasive grains, and a rotary pad (Refer to claims). A film-removing method of removing metal films, silicon oxide films and silicon nitride films disclosed in Reference patent document 2 (U.S. Pat. No. 3,923,567) uses an etching process using an acid (Refer to claims). A film-removing method disclosed in Reference patent document 3 (JP-A No. 17833/1997) measures an infrared absorption spectrum indicating infrared absorption by a used wafer prior to a film-removing process to estimate the type of the film formed on the used wafer, and removes the film by a suitable etching process (Refer to claims).

Metal concentration on the wafer surface can be reduced by removing the film by these methods. Therefore those methods are effective in reclaiming used wafers covered with films containing metals used for fabricating semiconductor devices, such as Al, Ti and W. A Si wafer reclamation process processes used wafers covered with films containing various metals, such as metal films, metal silicide films, metal oxide films, metal nitride films and such. It has been known that, although it is possible that some metals, such as Al, Ti and W, removed from used wafers adhere again to the surfaces of the wafers in the wafer reclamation process, the metals once removed from the wafers do not permeate the wafers. Thus, it has been possible to reduce metal concentration on the surface only by the aforesaid film-removing method.

Recently, Cu has become used prevalently as a wiring material instead of Al which has been widely used as a wiring material. Copper, as compared with Al, has satisfactory electrical conductivity, has high resistance against degradation by electromigration, and is more suitable as a material for forming wiring lines than Al. However, since Cu, as compared with other transition metals, has a very large diffusion coefficient in silicon, Cu not only adheres to the surface of a wafer but also penetrates and diffuses easily in the wafer. Moreover, it is suspected that contamination with Cu spreads over the stages of the reclamation process and other products are contaminated with Cu. It is difficult to remove Cu permeated the wafer even by the aforesaid film-removing method.

With a view to reclaiming a Si wafer provided with a Cu film, a method of removing a Cu film disclosed in Reference patent document 4 (JP-A No. 158207/2002) dissolves the Cu film with a special etching chemical solution (Refer to claims). This method, however, needs the special etching chemical solution and can be applied only to reclaimable wafers provided with a special film, such as a barrier film for stopping Cu diffusion or a $SiO_2$ film, before using the same as test wafers.

A method of reclaiming Si wafers provided with a metal film, such as a Cu film, disclosed in Reference patent document 5 (JP-A No. 164558/2000) removes a metal film by chemical etching using an alkali solution or an acid solution (Refer to claims). This method, however, is intended to remove metallic contaminants in the surface of an oxide film underlying a metal film and has difficulty in detecting and removing Cu permeated a Si wafer.

A nondestructive Cu content measuring method of measuring the Cu content of a Si wafer is disclosed in Reference patent document 6 (JP-A No. 64113/1997), however it is not intended for detecting contamination with Cu in a Si wafer reclamation process. This method includes the steps of heating a semiconductor wafer at a temperature not higher than 600° C., and measuring Cu concentration on the surface of the semiconductor wafer (Refer to claims). This method uses the effect of heating the semiconductor substrate on gathering Cu diffused in the semiconductor wafer on the surface of the Si wafer. This method, according to description provided in the specification, heats a Si wafer at a high temperature of about 500° C. The inventors of the present invention found through studies that the quality of a Si wafer is deteriorated when the Si wafer is heat-treated at such a high temperature. Thus, it is improper to apply this method to the reclamation of used Si wafers.

It is reported in Reference literature 1 (Helene Prigge, Peter Gerlach, Peter O. Hahn, Anton Schnegg, and Herbert Jacob, "TECHNICAL PAPERS SOLID-STATE SCIENCE AND TECHNOLOGY", J. Electrochem. Soc., 1991, Vol.

138, No. 5, 1385–1389) that a wafer polished by using a polishing slurry containing amine or ammonia as an alkali component undergoes bulk contamination with Cu if Cu is mixed into the polishing slurry and, consequently, the electrical conductivity of p-type Si wafers changes (Refer to ABSTRACT, P. 1385). However, studies mentioned in Reference literature 1 was made to elucidate a phenomenon that causes chemical-mechanical polishing to change the resistivity of a Si wafer, and merely found that the contamination of the Si wafer with Cu in the polishing process was the cause of the phenomenon, which is different from the conventional idea that the change of the resistivity of a Si wafer is due to the inactivation of the dopant by hydrogen atoms and structural defects caused by polishing. Thus, the studies mentioned in Reference literature 1 are not intended at all to specify a Cu-contamination-causative step in the Si wafer reclamation process, for which the present invention is intended.

SUMMARY OF THE INVENTION

The present invention has been made in view of the foregoing circumstances and it is therefore a first object of the present invention to provide a Cu-contamination-causative step specifying method or a Cu-contamination detecting method capable of nondestructively, simply, accurately detecting the contamination of a Si wafer with Cu during a Si wafer reclamation process.

A second object of the present invention is to provide a Si wafer reclaiming method using the aforesaid Cu-contamination-causative step specifying method or the Cu-contamination detecting method.

The gist of the method of specifying Cu-contamination-causative step or steps, or the method of detecting Cu-contamination to achieve the first object of the present invention resides in:

(1) a method of specifying a Cu-contamination-causative step or steps in a Si wafer reclamation process including plural steps in combination, comprising:

using p-type Si wafers, or p-type Si wafers and n-type Si wafers as monitor wafers, and performing a measuring the electrical resistance of the monitor wafers at least once before and after one of the steps or a series of successive steps during the Si wafer reclamation process (first method);

(2) prior to the application of the aforementioned method (1), heating Si wafers subjected to a reclamation process at a temperature in the range of 100 to 300° C. for a time in the range of 20 min to 10 hr and cleaning the wafers (hereinafter, referred to as "heating and cleaning") are performed after all films on the wafers have been removed from the surface of the wafers to specify a Cu-contamination-causative step or steps following heating and cleaning by means of the aforementioned method (1) (second method); or (3) a method of detecting Cu-contamination that performs a measuring operation for measuring the electric resistance of the Si wafers before and after the heating and cleaning process of (2) to detect Cu-contamination caused before the heating and cleaning process (third method).

The gist of the Si wafer reclaiming method of the present invention to achieve the second object of the present invention resides in removing causes of Cu-contamination after specifying the Cu-contamination-causative step or steps during a Si wafer reclaiming process by the methods mentioned in (1), (2) and (3).

DETAILED DESCRIPTION OF THE PREFERRED EMBODIMENTS

Figure 1:
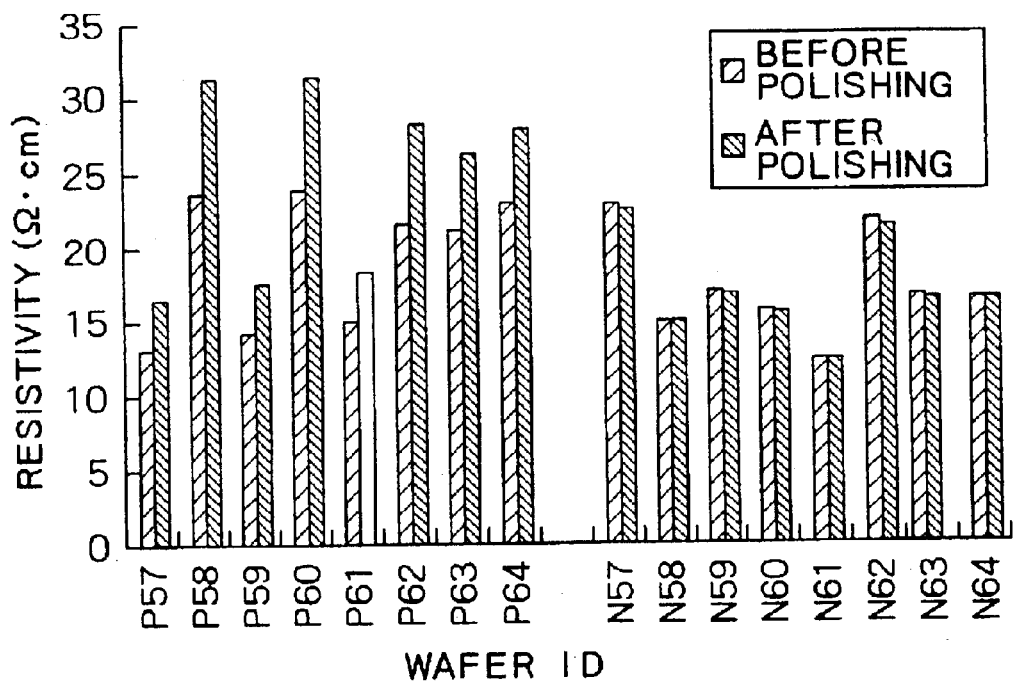
FIG. 1 is a graph showing the resistivities of monitor wafers measured before and after polishing using a Cu-containing polishing slurry.

The inventors of the present invention made studies to provide a method capable of nondestructively, simply, accurately detecting bulk contamination of wafers with Cu in a reclamation process and have found the following facts.

(1) When the resistivities of p-type Si wafers, or p-type and n-type Si wafers as monitor wafers are measured before and after each of processes, such as a film-removing process, a mirror-finish polishing process and a cleaning process, or before and after the successive processes in a reclamation process using those processes in combination, (i) it is decided that Cu-contamination occurred if the electrical resistance of the p-type Si wafer increases after the process; the reliability of the detection of a Cu-contamination-causative process is enhanced if the electrical resistance of the n-type Si wafer remains unchanged after the process, (ii) it can be decided that Cu-contamination did not occur in the process if the electrical resistance of the p-type Si wafer remains unchanged after the process; the reliability of the decision that Cu-contamination did not occur is enhanced if the electrical resistance of the n-type Si wafer remains unchanged after the process, the contamination of the Si wafer with Cu during reclamation can be nondestructively, simply, accurately detected by this specifying method (specifying a Cu-contamination-causative step by measuring the electrical resistance of the monitor wafer before and after the step in the reclamation process);

(2) Since Cu penetrated into the Si wafer can be eliminated without deteriorating the quality of the Si wafer by a predetermined heat process and a predetermined cleaning process (heating and cleaning operation) in the reclamation process after the removal of the films, a Cu-contamination-causative step can be further efficiently specified by using the heating and cleaning operation in combination with the specifying method mentioned in (1), more concretely, (i) The Cu-contamination-causative process is limited to a process after the heating and cleaning treatment by carrying out the specifying method mentioned in (1) for the Si wafer from which the film has been removed, in the Si wafer reclamation process subsequent to heating and cleaning after the heating and cleaning operation has been carried out, and the Cu-contamination-causative process after the processes that are carried out after heating and cleaning, (ii) Cu contamination that occurred before heating and cleaning can be detected by measuring the electrical resistivity of the Si wafer before and after the heating and cleaning operation.

The present invention has been made on the basis of those facts.

Methods according to the present invention will be described on the basis of experimental data on which the present invention is based.

Experiment 1 (Relation Between the Penetration of Cu into Silicon and Change of Electrical Resistance)

The inventors of the present invention made studies to examine the effect of application of a phenomenon that the electrical resistance of a p-type Si wafer increases if Cu is incorporated into the crystal lattices of the p-type Si wafer to a Si wafer reclaiming method on the accurate detection of Cu contamination in a series of steps of a reclamation process.

More concretely, p-type and n-type Si wafers were polished in the same batch with a polishing slurry containing 2 ppm Cu prepared by dissolving copper nitrate in a commercial polishing slurry (colloidal silica) containing alkanolamine. The resistivities of the p-type and n-type Si wafers were measured before and after polishing by a commercial eddy-current resistivity measuring instrument. An eddy-current resistivity measuring method is described in ASTM F673. The resistivities of Si wafers polished with a polishing slurry not containing copper nitrate were measured before and after polishing for comparison. Eight test p-type Si wafers and eight test n-type Si wafers were subjected in a batch to each experimental process. Results of measurement are shown in FIGS. 1 and 2.

FIG. 1 is a graph showing the resistivities of the Si wafers measured before and after polishing using the Cu-containing polishing slurry. As obvious from FIG. 1, whereas polishing increased the resistivities (reduces the electrical conductivities) of the p-type Si wafers significantly, the same did not change the resistivities of the n-type Si wafers at all.

Figure 2:
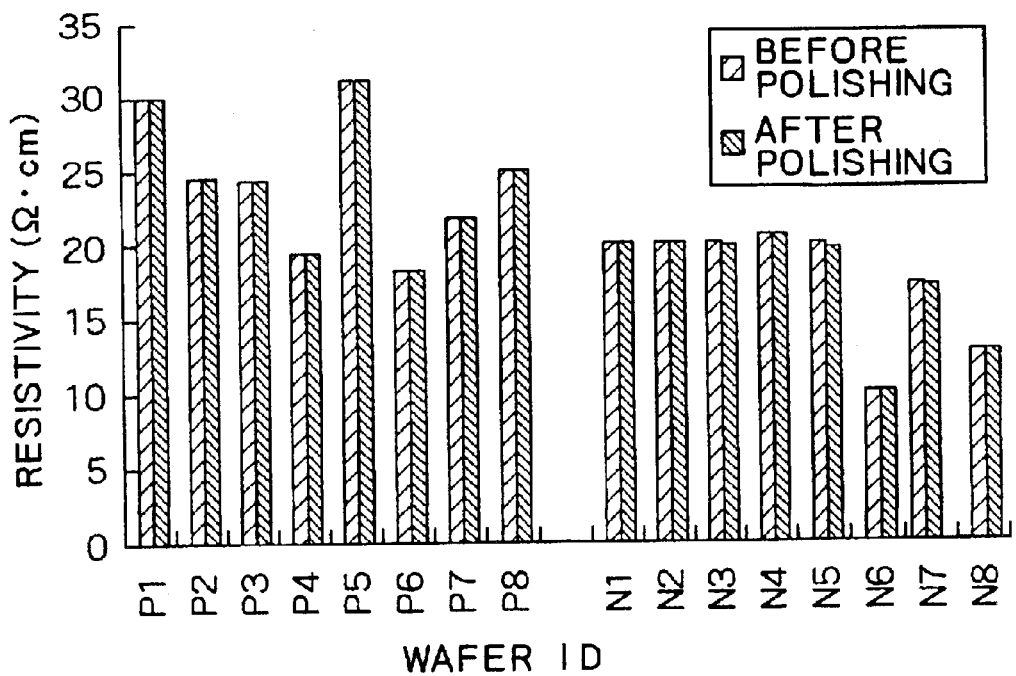
FIG. 2 is a graph showing the resistivities of monitor wafers measured before and after polishing using a polishing slurry not containing any Cu.

FIG. 2 is a graph showing the resistivities of the Si wafers measured before and after polishing using the polishing slurry not containing Cu. As obvious from FIG. 2, polishing did not change the resistivities of both the p-type and the n-type Si wafers at all.

Figure 4:
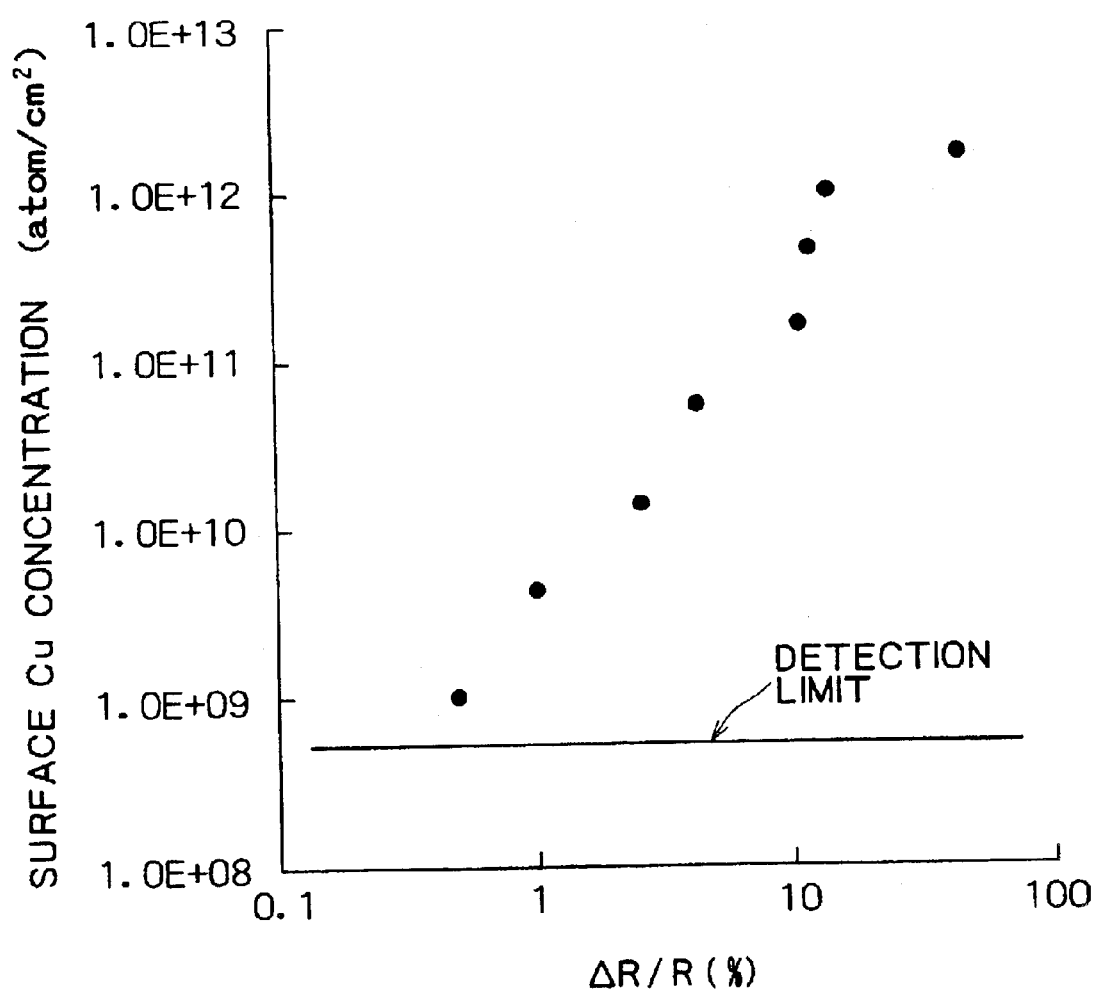
FIG. 4 is a graph showing the relation between surface Cu concentration on a p-type Si wafer polished with a Cu-containing polishing slurry and heated at 200° C. for 2.5 hr, and the ratio of change of sheet resistivity.

It is known from the results of the experiment that, when Cu permeates Si wafers, the electrical conductivity of p-type Si wafers decreases while that of n-type Si wafers does not change at all; that is, it is possible to decide that Si wafers were contaminated with Cu if only the electrical resistance of p-type Si wafers was increased and the electrical resistance of n-type Si wafers was not changed by a Si wafer reclamation process when the p-type and the n-type Si wafers were subjected simultaneously to the Si wafer reclamation process. It was found through studies that the ratio of change of electrical resistance and the Cu content of the Si wafer are closely correlated (FIG. 4). Although the experiment measured resistivity, surface resistance may be measured instead. It was confirmed that measured surface resistances indicated the same experimental results.

Thus, the use of p-type Si wafers, or p-type and n-type Si wafers as monitor wafers for Si wafer reclamation and the measurement of the electrical resistances of the monitor wafers before and after each step or the successive steps is very useful for the detection of Cu contamination in those steps and for specifying a Cu-contamination-causative step included in the Si wafer reclamation process.

Experiment 2 (Relation Between the Change of Electrical Resistance and Heat Treatment)

Studies were made to examine the change of the resistivity of Cu-contaminated Si wafers caused by the heat treatment of those Si wafers.

The p-type Si wafers obtained by polishing the p-type wafers respectively having resistivities in the range of 15 to 25 $\Omega\cdot$cm with the Cu-containing polishing slurry in Experiment 1 were heated at temperatures in the range of a room temperature to 300° C. for times in the range of 0 to 10 hr. The ratio of change of resistivity: $\Delta R/R$, where $\Delta R$ is the change of resistivity, i.e., the difference between the resistivity measured before polishing and that measured after heating, and R is the resistivity before polishing, was determined by the method specified in ASTM F673.

Figure 3A:
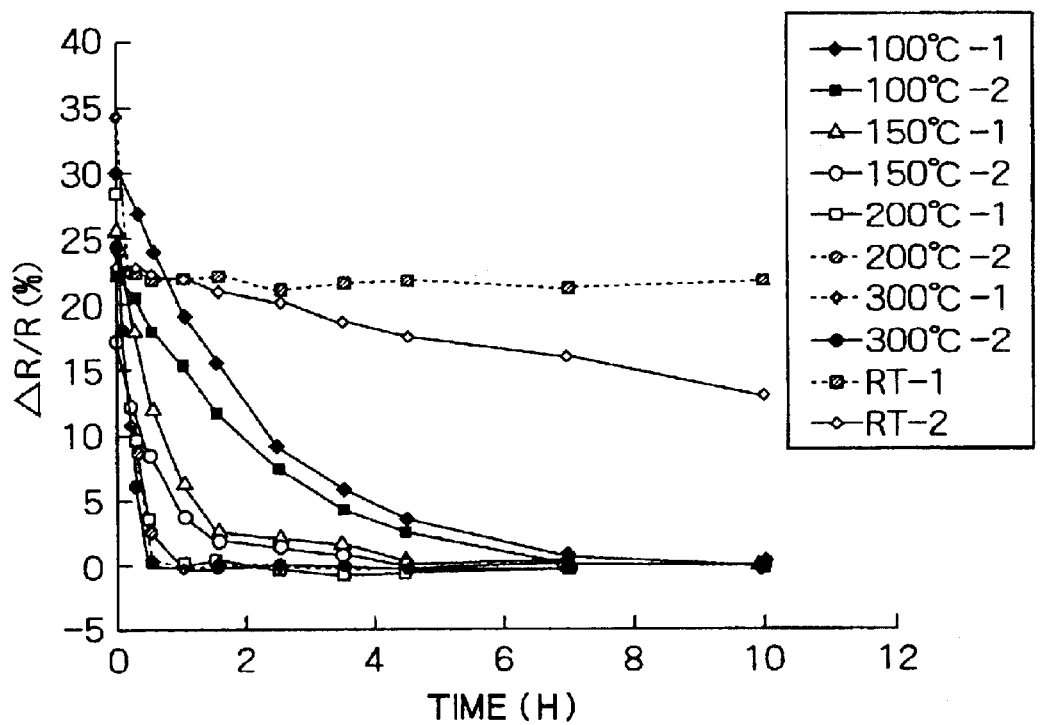
FIG. 3A is a graph showing the variation of the resistivity of a p-type Si wafer polished with a Cu-containing polishing slurry with time.
Figure 3B:
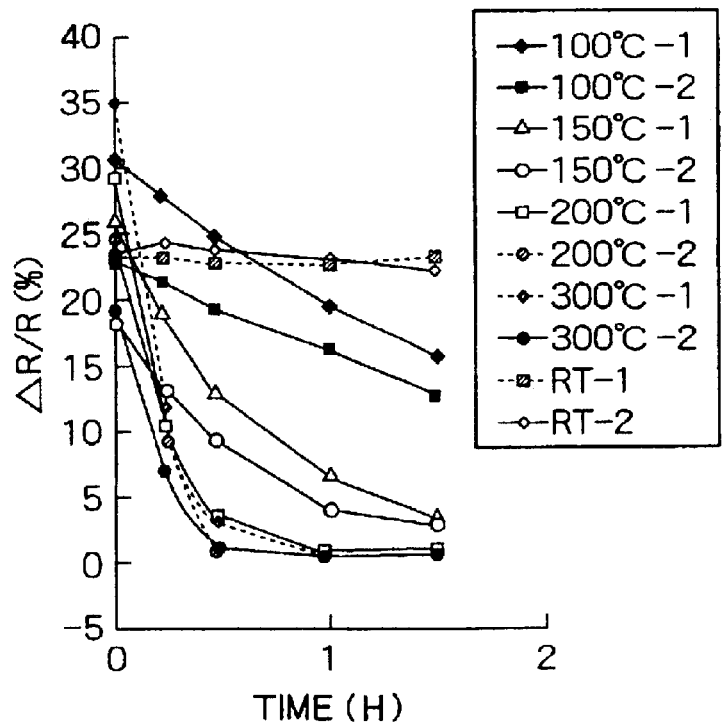
FIG. 3B is a graph showing an enlarged part of FIG. 3A.

Two Si wafers were subjected simultaneously to the heat treatment. Measured results are shown in FIG. 3A. A part of the graph shown in FIG. 3A corresponding to the time range of 0 to 1.5 hr is shown in an enlarged view in FIG. 3B. The reduction of the ratio of change of resistivity to zero signifies that the Si wafer recovered the resistivity before polishing; that is, all the Cu permeated the Si wafer migrated from the interior to the surface of the Si wafer. It was confirmed through Experiment 2 that the resistivities of the n-type Si wafers do not change.

The following facts are known from those drawings.

The ratio of change of resistivity of the Si wafer did not decrease to 0 when the Si wafer was kept at a room temperature RT as long as 10 hr. The ratios of change of resistivity of some of the Si wafers decreased to 0, i.e., some of the Si wafers recovered their original resistivities, after the Si wafers had been kept at a room temperature for 72 hr, and the rest of the Si wafers did not recover their original resistivities even though the same had been kept at the room temperature over 100 hr. Thus, the time rates of reduction of the ratios of change of resistivity of those Si wafers scattered in a wide range. Data for heating time longer than 10 hr is not shown in FIG. 3A.

The Si wafers recovered their original resistivities when the same were heated at 100° C. for about 10 hr, at 150° C. for about 3.5 hr, 200° C. for about 2 hr, and at 300° C. for about 20 min.

Thus, it was found that Cu incorporated into the crystal lattices of the Si wafer can be made to migrate to the surface of the Si wafer by heat treatment that heats the Si wafer at a temperature in the range of 100 to 300° C. for a proper time in the range of 20 min to 10 hr. Although data for temperatures exceeding 300° C. are not shown in FIG. 3A, experiments proved that the mode of reduction of the ratios of change of resistivity of Si wafers heated at temperatures exceeding 300° C. is similar to those shown in FIG. 3A.

Experiment 3 (Relation Between Effect of Heat Treatment on the Change of Electrical Resistance, and Surface Cu Concentration)

Experiment 3 was conducted to examine the relation between the ratios of change of resistivity of p-type Si wafers, and the concentration of Cu caused to migrate to the surface by heat treatment.

P-type Si wafers respectively having resistivities in the range of 15 to 25 Ω·cm were polished with Cu-containing polishing slurries having different Cu concentrations by changing dissolved copper nitrate concentration. The surface resistances of the p-type Si wafers were measured before and after polishing by the four-probe method specified in, for example, ASTM F374, and ratios of change of surface resistance were calculated.

Surface Cu concentration on the polished Si wafers was measured by vapor-phase decomposition inductively coupled plasma mass spectrometry (VPD ICP-MS) after heating the polished p-type Si wafers at 200° C. for 2.5 hr. Surface Cu concentration detection limit of this method is $5 \times 10^8$ atoms/cm$^2$. It was confirmed that the p-type Si wafers recovered their surface resistances in a state before polishing, i.e., a state not contaminated with Cu, after the heat treatment; that is, all the Cu permeated the p-type Si wafers migrated from the interior to the surfaces of the p-type Si wafers. Therefore, the measurement of the surface Cu concentration is equivalent to the measurement of the Cu concentration of the p-type Si wafer.

FIG. 4 shows the relation between the ratio of change of sheet resistivity and surface Cu concentration in a logarithmic graph. As obvious from FIG. 4, the ratio of change of sheet resistivity and surface Cu concentration are closely correlated (FIG. 4). Surface resistivity corresponds to the amount of Cu permeated the Si wafer. For example, surface Cu concentration is about $1.0 \times 10^9$ atoms/cm$^2$ when the ratio of change of sheet resistivity is 0.5% and, assuming that Cu migrated equally to the front and the back surface of the Si wafer, an estimated amount of Cu permeated the Si wafer is about $2.0 \times 10^9$ atoms/cm$^2$, which is within an allowable range for Si wafers. Therefore, if the ratio of change of sheet resistivity calculated by using sheet resistivities before and after the reclamation process is small, it is estimated that Cu permeated the Si wafer scarcely and the Si wafer was contaminated with Cu scarcely.

Experiment 4 (Relation Between Change of Electrical Resistance and Heating Temperature)

The upper limit of heating temperature will be considered.

Figure 5:
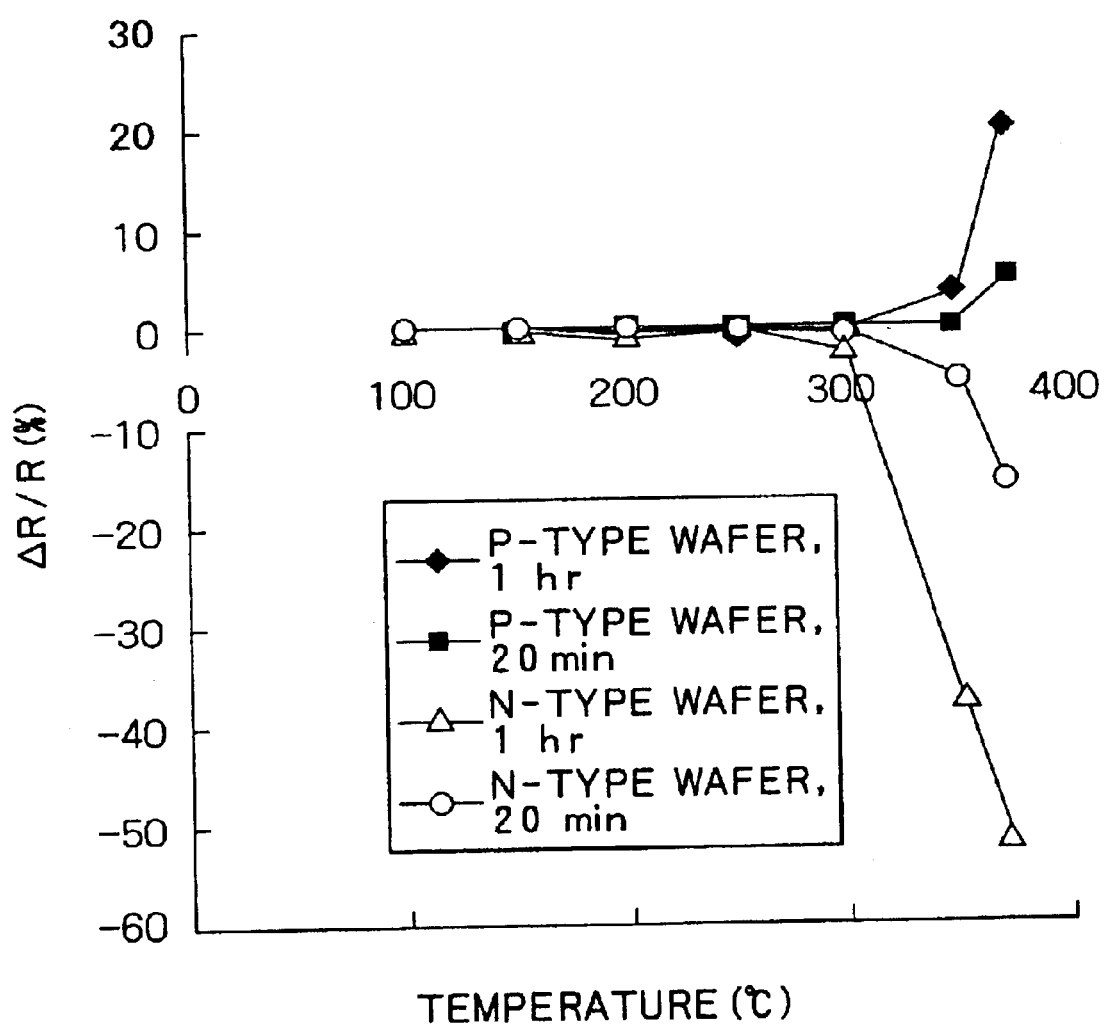
FIG. 5 is a graph showing the ratio of change of resistivity calculated by using resistivities of p-type and n-type Si wafers measured before and after heat treatment under different heating conditions.

P-type and n-type Si wafers not contaminated with Cu and having resistivities in the range of 10 to 25 Ω·cm were heated under different heating conditions by heat treatment. Resistivities of the p-type and the n-type Si wafers were measured before and after the heat treatment, and ratios of change of resistivity were calculated using the measured resistivities. FIG. 5 is a graph showing the relation between the ratio of change of resistivity and heating conditions.

As obvious from FIG. 5, the ratios of change of the respective resistivities of both the p-type and the n-type Si wafers are 0 when the p-type and the n-type Si wafers were heated at temperatures in the range of 100 to 300° C. for 20 min and 1 hr. respectively, and there was a tendency that the resistivities of the p-type Si wafers increase and those of the n-type Si wafers decrease when the p-type and the n-type Si wafers are heated at temperatures exceeding 300° C. This tendency was more significant at higher heating temperatures.

Since Experiment 4 used the Si wafers not contaminated with Cu, it was confirmed that changes in the resistivities of Si wafers are dependent on some factors other than Cu when the heating temperature is higher than 300° C.

It was found from the results of both Experiments 2 and 4 that, although the higher the heating temperature, the quicker is the migration of Cu to the surface, the electrical conductivity of Si wafers is caused to change by some factors other than Cu. Therefore, suitable heating temperatures are in the range of 100 to 300° C.

A Cu-contamination-causative step specifying method of the present invention based on the foregoing basic experiments will be described hereinafter.

A Cu-contamination-causative step specifying method in a first embodiment according to the present invention of specifying a Cu-contamination-causative step or steps in a Si wafer reclamation process comprising plural steps in combination uses p-type Si wafers, or p-type Si wafers and n-type Si wafers as monitor wafers, and performs a measuring operation for measuring the electrical resistance of the monitor wafers at least once before and after a single step or a series of successive steps during the Si wafer reclamation process.

The method of specifying Cu-contamination-causative step or steps in the first embodiment utilizes the phenomenon that, whereas the electrical resistance of a p-type Si wafer increases, the electrical resistance of an n-type Si wafer does not when the p-type and the n-type Si wafers are contaminated with Cu.

Although a mechanism that reduces the electrical conductivity of a p-type Si wafer when Cu is incorporated into crystal lattices of the p-type Si wafer is not elucidated explicitly, it is inferred that the electrical conductivity is reduced by the following causes.

Generally, a used Si wafer is reclaimed through a film-removing process of removing a film formed on a surface of a Si wafer, a polishing process of polishing the surface of the Si wafer from which the film has been removed, and a cleaning process of cleaning the polished wafer.

Most of these processes of the wafer reclamation process are wet processes, such as a chemical etching process, a lapping process, a mechanochemical polishing process included in the film-removing process, and a primary cleaning process and a final cleaning process included in the cleaning process. The Si wafer is exposed to heat of 100° C.

or below in those processes. Although the Si wafer is heated locally at temperatures not lower than 100° C. for a short time in a lapping process and a mechanochemical polishing process that exerts mechanical actions on the Si wafer, the mean of those temperatures at which the Si wafer is heated locally for a short time is lower than 100° C. When the Si wafer is exposed to heat of a temperature not higher than 100° C., Cu permeated the Si wafer is held in the crystal lattices and does not in other states, such as a compound of Si and Cu, or a combination of Cu and defects in Si.

Cu incorporated into Si crystal lattices is potentially stable and exists in $Cu^+$ ions having an electron configuration of $(1s)^2(2s)^2(2p)^6(3s)^2(3p)^6(3d)^{10}$.

An element of the group III typified by B (boron) is used as a dopant for a p-type Si wafer. The dopant of the group III replaces Si atoms of a Si crystal, remains at lattice points of the Si crystal, and is negatively charged. The effect of the dopant is compensated if the negatively charged dopant is attracted electrostatically to the, $Cu^+$ ions incorporated into the Si crystal lattices to form a complex and, consequently, the electrical conductivity of the p-type Si wafer decreases.

An element of the group V typified by P (phosphorus) is used as a dopant for an n-type Si wafer. The dopant of the group V is positively charged. Therefore, the positively charged dopant is not attracted electrostatically to the $Cu^+$ ions incorporated into the Si crystal lattices and does not form any complex. Therefore, the electrical conductivity of the n-type Si wafer does not change.

According to this mechanism, it is considered that Cu is not only the element that can be detected by the foregoing detecting operation, and in principle, the detecting method is capable of detecting metallic elements capable of producing a complex together with the dopant of the group III diffused in the p-type Si wafer, incapable of producing any complex together with the dopant of the group V diffused in the n-type Si wafer, and having a large diffusion coefficient in Si. Therefore, it is theoretically possible to consider that it is not safe to decide only on the basis of the result of detection by the aforesaid detecting method that the contaminant is Cu. However, it is practically hardly possible to consider that there are metallic elements that can be introduced into Si wafers and meet the foregoing requirements other than Cu. In other embodiments, which will be described later, Cu was only the element that could be found on the surfaces of Si wafers. Thus, the present invention concluded that the contaminants that must be detected by the foregoing detecting method could be limited to Cu.

Figure 6:
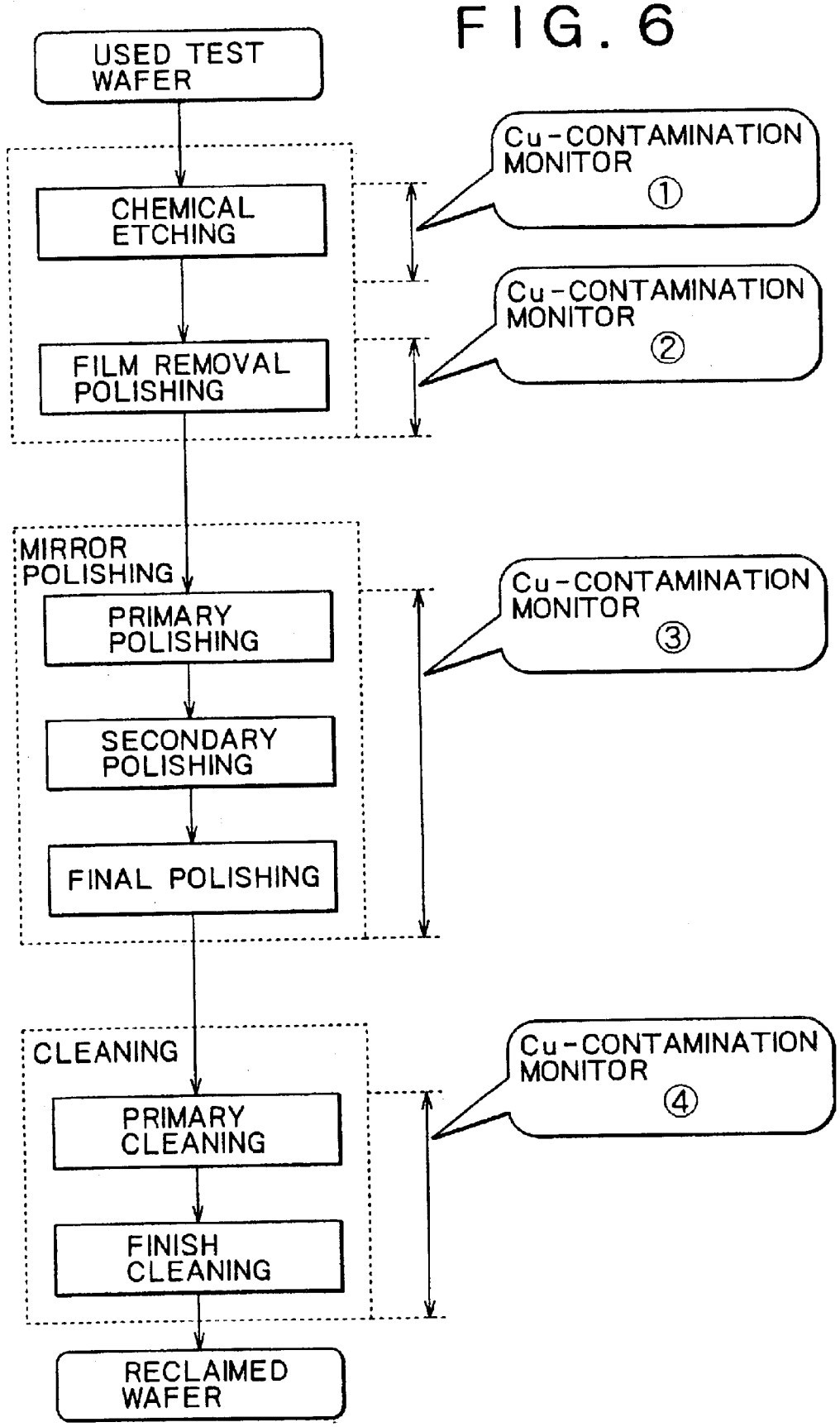
FIG. 6 is a flow chart of a Si wafer reclaiming process using a Cu-contamination-causative process specifying method in a preferred embodiment according to the present invention.

The Cu-detecting operation may be performed before and after a single step or a series of successive steps in a wafer reclamation process. The Cu detecting method will be concretely described in connection with a Si wafer reclamation process shown in FIG. 6. The electrical resistance of a monitor wafer may be measured before and after a single process like a Cu-contamination monitoring method ① (method that measures the resistivity of the monitor wafer before and after chemical etching in a film-removing process), a Cu-contamination monitoring method ② (method that measures the resistivity of the monitor wafer before and after polishing in a film-removing process) or a Cu-contamination monitoring method ④ (method that measures the resistivity of the monitor wafer before primary cleaning and after final cleaning in a cleaning process). The electrical resistance of a monitor wafer may be measured before and after a plurality of successive processes like a Cu-contamination monitoring method ③ (method that measures the resistivity of the monitor wafer before primary polishing and after final polishing in a mirror polishing process). Naturally, in some cases, a wafer reclamation process, such as including a mirror polishing process that performs a pretreatment before face mirror polishing, other than that shown in FIG. 6 is used. In such a case, the electrical resistance may be measured before and after the process.

When the Cu-detecting operation is performed either before and after a single step or before and after a series of successive steps, it is possible to decide that the Si wafer was contaminated with Cu if a value measured after the process is greater than that measured before the process. If the electrical resistance of the n-type Si wafer remained unchanged, the reliability of the decision is further enhanced.

The detecting operation is performed at least once during the Si wafer reclamation process. For example, all the four Cu-contamination monitoring methods ① to ④ may be performed or the detecting operation may be performed once, twice or more than twice.

It is recommended to use p-type and n-type Si wafers having a resistivity in the range of 5 to 50 Ω·cm as monitor wafers. The lower the dopant concentration of the p-type Si wafer (the higher the resistivity of the p-type Si wafer), the higher the sensitivity of change of electrical resistance due to Cu-contamination. Cu-contamination detection sensitivity is low when the resistivity is below 5 Ω·cm. Although it is preferable that the Si wafer has a large resistivity, the effect of contaminants other than Cu becomes significant, the accuracy of detection is reduced, and the measurement of resistivity is difficult if the resistivity of the Si wafer is excessively large. Preferably, the resistivity of the p-type Si wafer is in the range of 10 to 30 Ω·cm.

A Cu-contamination-causative step or steps can be further efficiently specified in the Si wafer reclamation process by using the Cu-detecting operation in combination with a heating and cleaning operation. A second and a third embodiment of the present invention, which will be described later, are typical combinations of those operations.

The heating and cleaning operation uses a phenomenon that Cu permeated a Si wafer migrates to the surface of the Si wafer when the Si wafer is heated. The present invention is characterized by determining the upper limit of heating temperature to achieve the primary object, 'Si wafer reclamation'.

The heating process is performed at a temperature in the range of 100 to 300° C. for a time in the range of 20 min to 10 hr. Such a heating condition is suitable for making Cu incorporated into crystal lattices of silicon migrate to the surface of the Si wafer, and for preventing factors other than Cu from changing the electrical resistance due to the formation of donors by interstitial oxygen atoms in the Si wafer and preventing Si wafer reclamation from being made difficult by the formation of donors.

The lower limit of the range of heating temperatures is 100° C. on the basis of the results of the basic experiments in FIG. 3. It takes a practically unacceptably long time to make Cu migrate from the interior to the surface of the Si wafer if the heating temperature is below 100° C. Preferably, the heating temperature is 150° C. or above, more preferably, 180° C. or above.

From the viewpoint of making Cu incorporated into Si crystal lattices migrate to the surface of a Si wafer, a higher heating temperature is desirable as obvious from FIG. 3. The Cu-contamination detecting method uses Si wafers having a resistivity in the range of 5 to 50 Ω·cm as monitor wafers. It is possible to make all the Cu permeated into Si wafers having a resistivity in the range of 5 to 50 Ω·cm migrate to the surface. FIG. 3A shows the results of experiments using Si wafers having a resistivity in the range of 15 to 25 Ω·cm. Experiments proved that the results of experiments using Si wafers having a resistivity in the range of 5 to 50 Ω·cm are similar to those shown in FIG. 3A.

The upper limit heating temperature is determined so that the deterioration of the accuracy of Cu-contamination detection by the change of electrical resistance caused by factors other than Cu can be prevented, the quality of Si wafers is guaranteed, and the reclamation of Si wafers, which is the object of the present invention, can be achieved. As mentioned above, although the higher the heating temperature, the quicker is the migration of Cu from the interior to the surface of the Si wafer and the shorter is the heating time, it is possible that factors other than Cu change the resistivity, (for example, the formation of donors by interstitial oxygen atoms form donors and the donors change the resistivity of the Si wafer) and Cu-contamination cannot be accurately detected if the heating temperature is higher than 300° C. If the heating temperature is excessively high, Cu and various defects in the Si wafer bond together to deteriorate the quality of the Si wafer. Thus, the upper limit heating temperature is 300° C., preferably, 280° C. or below.

The heating condition, i.e., a combination of a heating temperature and a heating time, is determined according to the size and resistivity of Si wafers, the type of a heating device to be used, and the size of a batch. Generally, the recommended heating time is in the range of 5 to 10 hr when the heating temperature is 100° C., in the range of 3 to 6 hr when the heating temperature is 150° C., in the range of 1 to 3 hr when the heating time is 200° C., in the range of 30 min to 2 hr when the heating temperature is 250° C., and 20 min to 1 hr when the heating time is 300° C.

Cu caused to migrate from the interior to the surface of a Si wafer by the heat treatment can be easily removed by a chemical or mechanical treatment. A cleaning treatment is a representative mechanical treatment. The cleaning treatment may use one of cleaning solutions generally used for Cu removal including nitric acid solutions, mixed solutions of nitric acid and hydrochloric acid, mixed solutions of sulfuric acid and hydrogen peroxide and mixed solutions of fluorine and hydrogen peroxide, or a mixture of some of those cleaning solutions. The mechanical treatment may be lapping, polishing or such capable of removing a thin surface layer of a wafer.

The heating and cleaning operation is performed after a film-removing process for removing all films formed on the surface of a Si wafer in the Si wafer reclamation process. Preferably, an oxide film formed by natural oxidation on the surface of a Si wafer after the removal of the film is removed before the heating and cleaning operation. The removal of the oxide film is effective in facilitating the migration of Cu from the interior to the surface of the Si wafer when the Si wafer is heated.

In view of decontaminating a Cu-contaminated Si wafer, it is recommended that the heating and cleaning treatment is performed at the latest possible stage of the Si wafer reclamation process, for example, immediately before the cleaning process. However, since flaws may possibly be formed in the surface of a Si wafer and the Si wafer needs to be subjected to mirror polishing to remove the flaws, it is preferable to perform the heating and cleaning operation before mirror polishing or during mirror polishing. The heating and cleaning treatment may be performed at an optimum stage meeting an actual reclamation process.

A Cu-contamination causative step specifying method of specifying a Cu-contamination-causative step or steps in a Si wafer reclamation process (second method) including the Cu-contamination detecting operation and the heating and cleaning operation in combination, and a method of detecting Cu-contamination occurred before heating and cleaning (third method) will be described.

The second method of the present invention specifies a Cu-contamination-causative step or steps at a stage of the Si wafer reclamation process after heating and cleaning. The second method executes the Cu-contamination detecting operation at a stage of the wafer reclamation process after heating and cleaning. Even if a Si wafer is contaminated with Cu at a stage of the reclamation process before heating and cleaning, all the Cu contaminating the Si wafer can be removed by the heating and cleaning operation, and hence it is advantageous that the Cu-detecting operation can be performed only after heating and cleaning.

Heating and cleaning may be performed at any stage after removal of a film from a Si wafer. Preferably, heating and cleaning is performed between primary polishing and secondary polishing. There is no particular restriction on a time for the Cu-contamination detecting operation provided that the time is after heating and cleaning.

The third method of the present invention detects Cu contamination that occurred before heating and cleaning through the measurement of the electrical resistance of a Si wafer before and after the heating and cleaning operation. The third method is able to detect Cu-contamination at a stage before heating and cleaning, and the Cu-contaminated Si wafer can be decontaminated by the heating and cleaning operation. Therefore, it is advantageous that the time for Cu-detecting operation using a monitor wafer can be limited to a stage after heating and cleaning.

The third method, differing from the first method, does not measure the electrical resistance of a monitor wafer, but measures the electrical resistance of a Si wafer to be reclaimed (test wafer). The third method detects Cu-contamination in a test wafer before heating and cleaning.

As mentioned above, there is no restriction on the time for heating and cleaning, provided that the time is after removal of the film. Preferably, heating and cleaning is performed before mirror polishing or during mirror polishing.

A method of reclaiming a Si wafer using the first to the third method will be described. The Si wafer reclamation method of the present invention specifies a Cu-contamination-causative process during reclamation by one of the first to the third method, and then decontaminates the Cu-contaminated Si wafer.

One of the foregoing methods is executed at least once during the Si wafer reclamation process. If the third method is executed, Cu-contamination occurred before heating and cleaning is detected, and the detecting operation is performed before and after a process preceding heating and cleaning to specify a Cu-contamination-causative process. It is decided that a Si wafer not contaminated with Cu could be reclaimed if there is no change in electrical resistance. It is decided that a Si wafer is contaminated with Cu if there is a change in electrical resistance, Cu as a contaminant is removed, and the Si wafer is subjected again to the Si wafer reclamation process to obtain a Si wafer not contaminated with Cu.

There is no particular restriction on the method of eliminating causes of Cu-contamination and any suitable eliminating method may be used according to the contaminant. To give an example, a polishing slurry that does not cause Cu-contamination may be used instead of the Cu-containing polishing slurry that may cause Cu-contamination. If the cleaning solution is a contamination source, the cleaning solution may be replaced with a cleaning solution that does not cause Cu-contamination. Cu-contamination can be controlled by adjusting the pH and redox potential of the cleaning solution.

EXAMPLE

Hereinafter, the present invention will be described in detail by way of example, which should not be construed to limit the technical scope of the present invention including all changes and modifications made in the example without departing from the context of the description of the present invention.

Description will made of a Cu-contamination-causative step specifying method according to the present invention, and a concrete example of a reclamation process for obtaining Si wafers not contaminated with Cu, capable of finding causes of Cu-contamination through the examination of a Cu-contamination-causative step or steps specified by the Cu-contamination-causative step specifying method, of removing contaminants and of providing Si wafers not contaminated with Cu by processing the Cu-contaminated Si wafers by a reclamation process.

A used Si wafer not contaminated with Cu was reclaimed by the Si wafer reclaiming process shown in FIG. 6. Concentrations of metals on the surface of the Si wafer were measured by VPD ICP-MS after keeping at a room temperature for about one week. Since all the Cu incorporated into the crystal lattices of the Si wafer kept at the room temperature for about one week has migrated to the surface of the Si wafer, the Cu concentration on the surface coincides with a Cu concentration in the Si wafer. Measured data is shown in Table 1

TABLE 1

| | Metal concentration on the surface ($1 \times 10^{10}$ atoms/cm$^2$) | | | | | | | | | |
|---|---|---|---|---|---|---|---|---|---|---|
| | Al | Ca | Cr | Cu | Fe | Mg | Ni | K | Na | Zn |
| Detection limit concentration | 0.3 | 0.1 | 0.1 | 0.05 | 0.1 | 0.3 | 0.05 | 0.2 | 0.2 | 0.06 |
| Before changing polishing slurry | D.L.* | D.L. | D.L. | 1.4 | D.L. | D.L. | D.L. | D.L. | D.L. | D.L. |
| After changing polishing slurry | D.L. | D.L. | D.L. | D.L. | D.L. | D.L. | D.L. | D.L. | D.L. | D.L. |

*DL: Equal to or below detection limit

As obvious from Table 1, only Cu concentration on the surface of the reclaimed Si wafer was high and the concentrations of other metals were below their detection limits. It is known that Cu permeated the Si wafer in some of the series of steps of the Si wafer reclamation process shown in FIG. 6.

Resistivities in the range of 12 to 24 Ω·cm of eight p-type Si wafers and eight n-type Si wafers as monitor wafers were measured before and after the series of steps of the Si wafer reclamation process including the film-removing process, the polishing process and the cleaning process (Cu-contamination monitoring methods ① to ④ by an eddy-current resistivity measuring method to examine the monitor wafers for Cu-contamination. In the film-removing process, the Cu-contamination monitoring method ① that measures the resistivity of the monitor wafer before and after chemical etching, the Cu-contamination monitoring method ② that measures the resistivity of the monitor wafer before and after polishing, the Cu-contamination monitoring method ③ that measures the resistivity of the monitor wafer before primary polishing and after final polishing, and the Cu-contamination monitoring method ④ that measures the resistivity of the monitor wafer before primary cleaning and after final cleaning were carried out.

Figure 7:
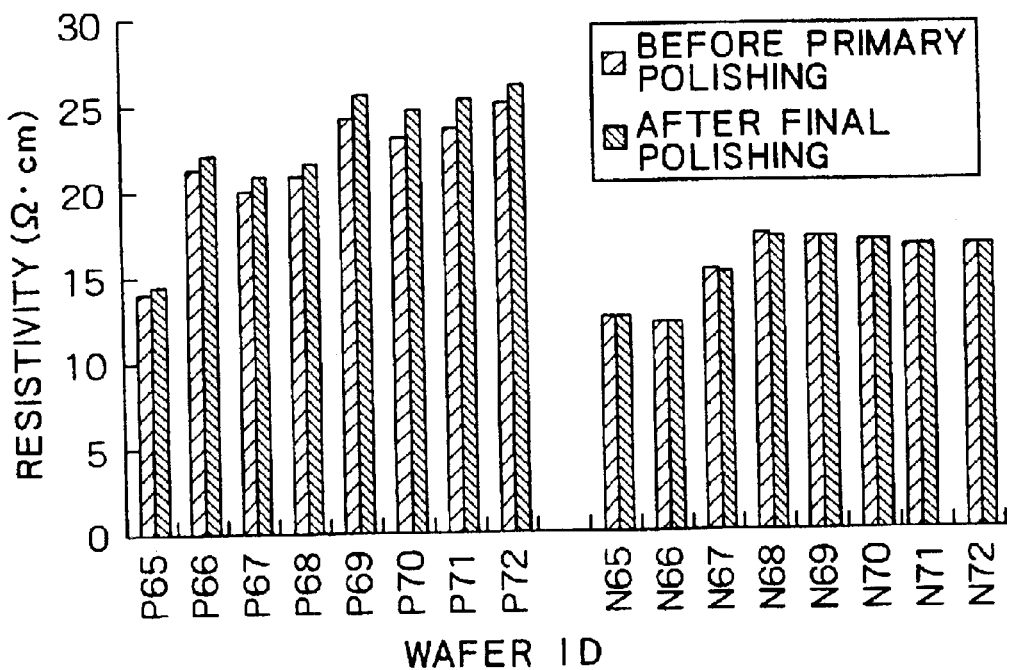
FIG. 7 is a graph showing the resistivities of monitor wafers before and after a polishing process.

It was found from data obtained by the execution of the Cu-contamination monitoring method ③ that the resistivities of the n-type Si wafers measured before primary polishing, and those of the same measured after final polishing were substantially the same, respectively, and changes in the resistivities of the p-type Si wafers caused by final polishing were significant (FIG. 7). It was known from data obtained by the execution of the methods ①, ② and ④ that the resistivities of the p-type and n-type Si wafers did not change at all.

The experimental results showed that the Si wafers were contaminated with Cu in some of the primary polishing process, the secondary polishing process and the final polishing process. It was conjectured that some of the polishing slurries used by those polishing processes contained Cu that caused Cu-contamination.

The polishing slurries used by those polishing processes were analyzed. The primary polishing process and the secondary polishing process used the polishing slurries of the same composition including alkanolamine as an alkali component, and the final polishing process used the polishing slurry of a composition different from those of the polishing slurries used by the primary and the secondary polishing process.

The polishing slurries used by the primary and the secondary polishing process contained 58 ppb Cu, and any Cu was not detected in the polishing slurry used by the final polishing process.

Figure 8:
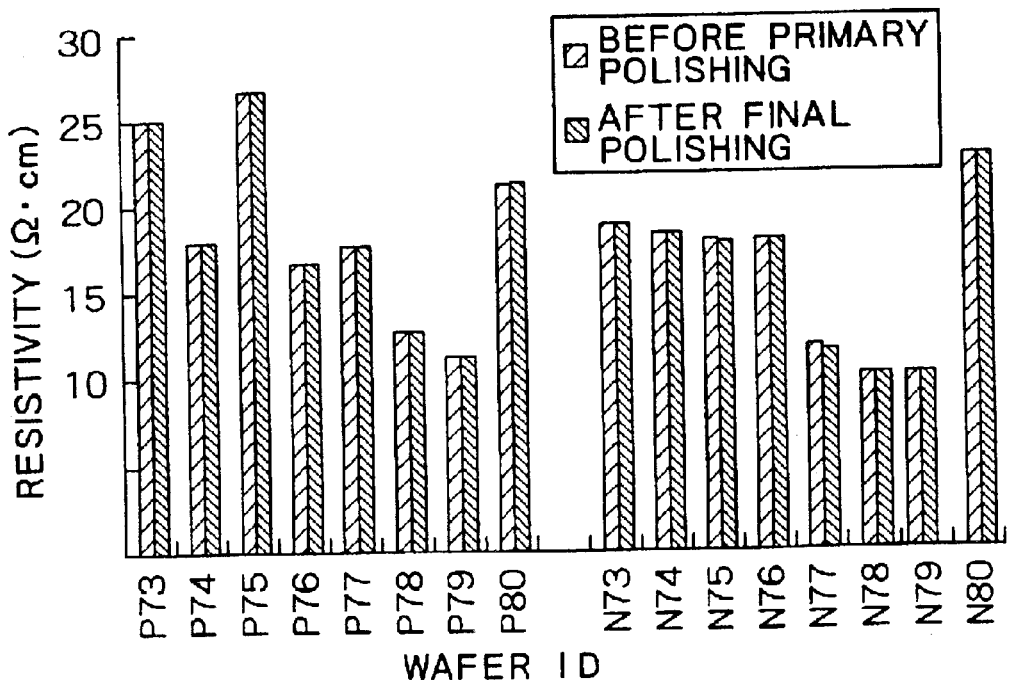
FIG. 8 is a graph showing the resistivities of monitor wafers before and after a polishing process using a polishing slurry not contaminated with Cu.

A high-purity polishing slurry (a slurry containing colloidal silica produced from high-purity alkoxylane by synthesis and proved that no Cu was detected therein by the foregoing method of analysis) was used instead of the polishing slurry used by the primary and the secondary polishing process. The Cu-contamination monitoring method ③ used p-type and n-type Si wafers as monitor wafers, and the resistivities of the monitor wafers were measured. The measurement showed that change in resistivity was not found in any one of those monitor wafers (FIG. 8). The measured Cu concentration of this polishing slurry was not greater than a detection limit of 10 ppb. The Si wafer reclamation process shown in FIG. 6 was carried out by using this high-purity polishing slurry in the primary and the secondary polishing process, and metal concentrations on the surface of the reclaimed Si wafer were measured by the aforesaid method. All the metal concentrations were not greater than the corresponding detection limits (Table 1).

Thus, it was found that the Cu-contamination-causative step specifying method of the present invention is capable of specifying a Cu-contamination-causative step or steps by examining changes in the resistivities of the monitor wafers, i.e., the p-type and the n-type Si wafers,.of reclaiming Si wafers not contaminated with Cu by using a polishing slurry not containing any Cu instead of the polishing slurry causing Cu-contamination in the primary and the secondary polishing process, and of preventing the introduction of Cu into the Si wafer reclamation process.

The Cu-contamination-causative process specifying method of the present invention is capable of nondestructively, simply, accurately detecting Cu that may contaminate Si wafers during the Si wafer reclamation process, and of specifying a process that will contaminate the Si wafers with Cu. Thus, the present invention enables the reclamation of Si wafers not contaminated with Cu.

The Cu-contamination-causative process specifying method of the present invention using measured electrical resistance or the Cu-contamination detecting method of the present invention is featured by (1) capability of nondestructive measurement, (2) simplicity scarcely needing sample preparation and (3) capability of quick, accurate measurement requiring a measuring time of about 6 s per wafer. These features enable the measurement of the electrical resistances of the monitor wafers and the total inspection of the Si wafers when resistance is controlled properly. Total inspection enhances the reliability of reclaimed Si wafers, demonstrates very excellent processing ability, and has a very important significance in the Si wafer reclamation business that deals with workpieces of irregular qualities.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A specifying method for a Cu-contamination-causative step or steps in a Si wafer reclamation process including plural steps in combination, comprising:
   using p-type Si wafers, or p-type and n-type Si wafers as monitor wafers, and performing an electrical resistance measuring operation for measuring electrical resistance of the monitor wafers at least once before and after one of the steps or before and after a series of successive steps during the Si wafer reclamation process.

2. The specifying method for a Cu-contamination-causative step or steps according to claim 1, wherein the monitor wafers have resistivities in the range of 5 to 50 $\Omega\cdot$cm.

3. The specifying method for a Cu-contamination-causative step or steps according to claim 1, wherein the monitor wafers have resistivities in the range of 10 to 30 $\Omega\cdot$cm.

4. The specifying method for a Cu-contamination-causative step or steps according to claim 1, wherein a heating and cleaning operation that heats a Si wafer at a temperature in the range of 100 to 300° C. for a time in the range of 20 min to 10 hr for cleaning is performed after all films formed on a surface of the Si wafer have been removed before the electrical resistance measuring operation to specify a Cu-contamination-causative step or steps among the steps following heating and cleaning.

5. The specifying method for a Cu-contamination-causative step or steps according to claim 4, wherein the monitor wafers have resistivities in the range of 5 to 50 $\Omega\cdot$cm, respectively.

6. The specifying method for a Cu-contamination-causative step or steps according to claim 4, wherein the monitor wafers have resistivities in the range of 10 to 30 $\Omega\cdot$cm, respectively.

7. A detecting method for Cu-contamination, comprising:
   executing an electrical resistance measuring operation for measuring electrical resistance of a Si wafer before-and after a heating and cleaning operation that heats the Si wafer at a temperature in the range of 100 to 300° C. for a time in the range of 20 min to 10 hr to detect Cu-contamination that occurred before heating and cleaning.

8. A reclamation method of Si wafer, comprising the steps of:
   specifying a Cu-contamination-causative step or steps during a Si wafer reclamation process by the method stated in claim 1; and
   eliminating causes of Cu-contamination from the Cu-contamination-causative step or steps.

9. A reclamation method of Si wafer, comprising the steps of:
   specifying a Cu-contamination-causative step or steps among the steps following a heating and cleaning treatment by the method stated in claim 4; and eliminating causes of Cu-contamination from the Cu-contamination-causative step or steps.

10. A method of reclaiming a Si wafer, said method comprising:

executing an electrical resistance measuring operation for measuring electrical resistance of a Si wafer before and after a heating and cleaning operation that heats the Si wafer at a temperature in the range of 100 to 300° C. for a time in the range of 20 min to 10 hr to detect Cu-contamination that occurred before heating and cleaning specifying a Cu-contamination-causative step or steps by the method stated in claim 1; and eliminating causes of Cu-contamination from the Cu-contamination-causative step or steps.

* * * * *